(12) United States Patent
Berkhout

(10) Patent No.: US 6,518,837 B2
(45) Date of Patent: Feb. 11, 2003

(54) PUSH-PULL AMPLIFIER

(75) Inventor: Marco Berkhout, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/864,133

(22) Filed: May 24, 2001

(65) Prior Publication Data
US 2002/0001342 A1 Jan. 3, 2002

(30) Foreign Application Priority Data
May 25, 2000 (EP) .............................. 00201818

(51) Int. Cl.[7] ................................. H03F 3/38
(52) U.S. Cl. ...................... 330/10; 330/10; 330/207 A; 330/251; 375/238
(58) Field of Search ................ 330/10, 207 A, 330/251; 375/238

(56) References Cited

U.S. PATENT DOCUMENTS

| | | | | |
|---|---|---|---|---|
| 4,458,208 A | * | 7/1984 | Abe | 330/10 |
| 4,504,793 A | * | 3/1985 | Yokoyama | 330/10 |
| 5,805,026 A | * | 9/1998 | Danz et al. | 330/10 |
| 5,974,089 A | | 10/1999 | Tripathi et al. | 375/247 |
| 6,275,072 B1 | * | 8/2001 | Dally et al. | 327/7 |
| 6,300,825 B1 | * | 10/2001 | Dijkmans et al. | 330/10 |

FOREIGN PATENT DOCUMENTS

| | | |
|---|---|---|
| EP | 0503571 A1 | 9/1992 |
| EP | 0798858 A2 | 10/1997 |

* cited by examiner

Primary Examiner—Michael B Shingleton
(74) Attorney, Agent, or Firm—Steven R. Biren

(57) ABSTRACT

The invention relates to a push-pull amplifier comprising a logic circuit for supplying control signals to the power switches comprising a carrousel part and a handshake part. In this way, it can be prevented that both switches can be closed at the same time.

20 Claims, 6 Drawing Sheets

PUSH-PULL AMPLIFIER

BACKGROUND OF THE INVENTION

The invention relates to a push-pull amplifier as described in the preamble of claim 1.

The invention further relates to a logic circuit for use in a push-pull amplifier.

The invention further relates to a method of creating timing signals.

The U.S. Pat. No. 5,974,089 describes a method and apparatus for performance improvement by qualifying pulses in an oversampled noise shaping signal processor. Herein the sampling frequency i.e., the rate at which the oversampled modulator is clocked, and the gain of the modulator loop, while adding pulse qualification logic before the switching stage to eliminate unacceptably narrow pulses achieves an improvement of for example audio amplifiers.

Further push-pull amplifiers are known whereby the timing of the switching unit is determined by passive components.

A disadvantage of this known method and push-pull amplifier is that the timing depends on temperature and process spread.

It is an object of the invention to provide a push-pull amplifier method, which does not have these disadvantages.

To this end a push-pull amplifier according to the invention comprises the features of claim 1.

The push-pull amplifier according to the invention has as a great advantage that the sequence of signals is determined beforehand independently of difference in timing of the different signals.

Embodiments of the invention are described in the dependent claims.

Herewith a cross-reference is made to the following co-pending applications of the same applicant and of the same date:
"Level shifter" applicant's ref. no. ID604680, Application No. 0 201 826.5
"Silent start" applicant's ref. no. ID604681, Application No. 0 201 827.3
"PWM limiter" applicant's ref. no. ID604682, Application No. 0 201 828.1
"Demodulation filter" applicant's ref. no. ID604683, Application No. 0 201 829.9.

BRIEF DESCRIPTION OF THE DRAWINGS

These and other aspects of the invention will be apparent from and elucidated with reference to the examples described hereinafter. Herein shows FIG. 1 block-schematic an example of a push-pull amplifier, FIG. 2 a timing diagram, FIG. 3 a state transition diagram, FIG. 4 an example of the handshake logic circuits, FIG. 5 another example of the logic circuit and switching unit.

DETAILED DESCRIPTION OF THE INVENTION

Figure 1:
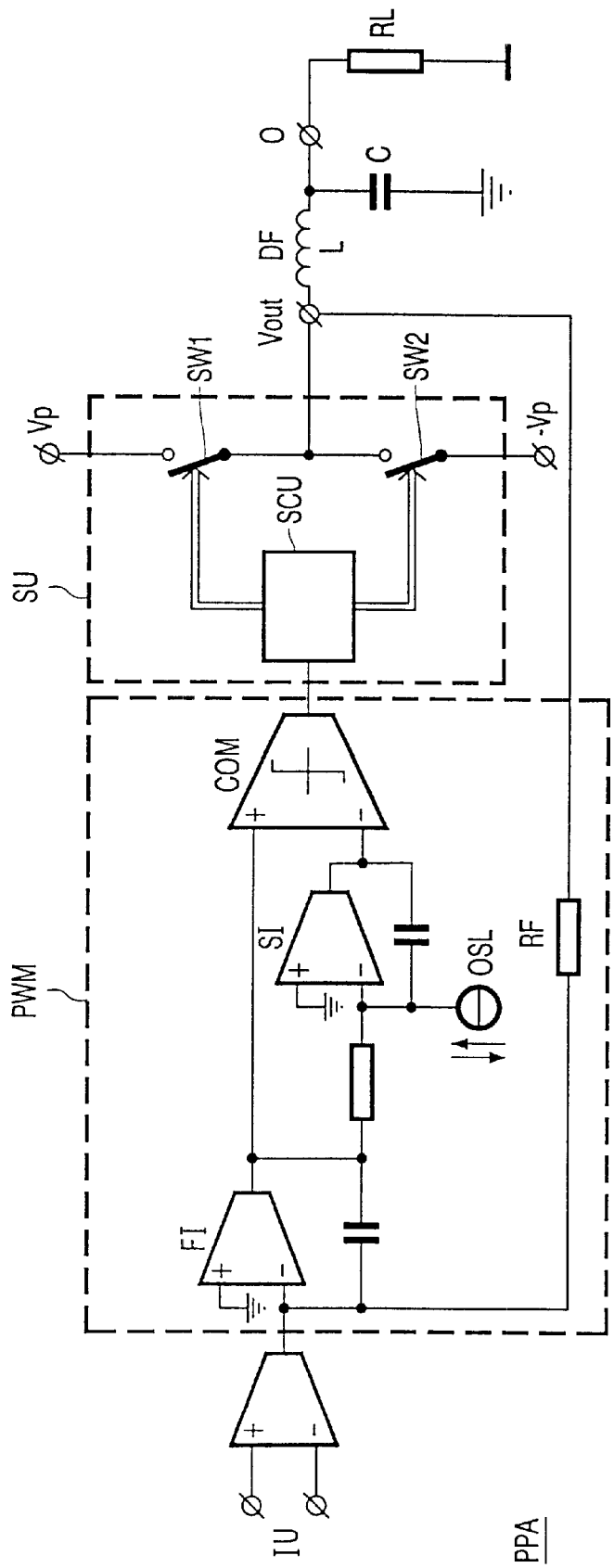

FIG. 1 shows block-schematic an example of a push-pull amplifier PPA according to the invention. Via an input unit IU the amplifier receives the input signal. The input unit is coupled to a pulse-width modulator PWM, which is coupled with an output to a switching unit SU. The switching unit supplies an output signal via a demodulation filter DF to the output O of the amplifier. The pulse-width modulator PWM is coupled in a feedback loop with a feedback element RF which is coupled with one side to the output of the switching unit SU and with the other side to the input of the pulse-width modulator. The pulse-width modulator further comprises a first integrator FI and a second integrator SI and a comparator COM, the input of the first integrator is coupled to the output of the input unit IU and the input of the second integrator is coupled to an output of the first integrator FI and also coupled to an oscillator OSC.

The switching unit SU comprises a switch control unit and a first and second switch SW1, SW2, respectively. The demodulation filter is in this example shown as an inductance L and a capacitance C can be a second order low-pass demodulation filter, or a higher order demodulation filter.

Instead of using two integrators it is also possible to use only one integrator. The inverting input of the comparator can than for example be supplied with a saw tooth signal.

In order to be robust against process and temperature variations it is undesirable to let the timing of the switching be determined by on-chip timeconstants. Therefore a handshake procedure can be used to control the switch timing. A circuit is added to both lowside and highside switch that generates a ready signal if the corresponding switch is off. The state of the switch can easily be detected by measuring the gate-source voltage of the DMOS transistor. If it is lower than the threshold voltage the switch is off, if it is higher than the threshold voltage the switch is on. In practice the exact decision level is not very critical. Due to the latch in the driver, the gate-source voltage is either at 0V or at 12V while the transitions between these two levels are very fast.

The handshake procedure forces a specific sequence in which the set and reset signals are generated.

Figure 2:
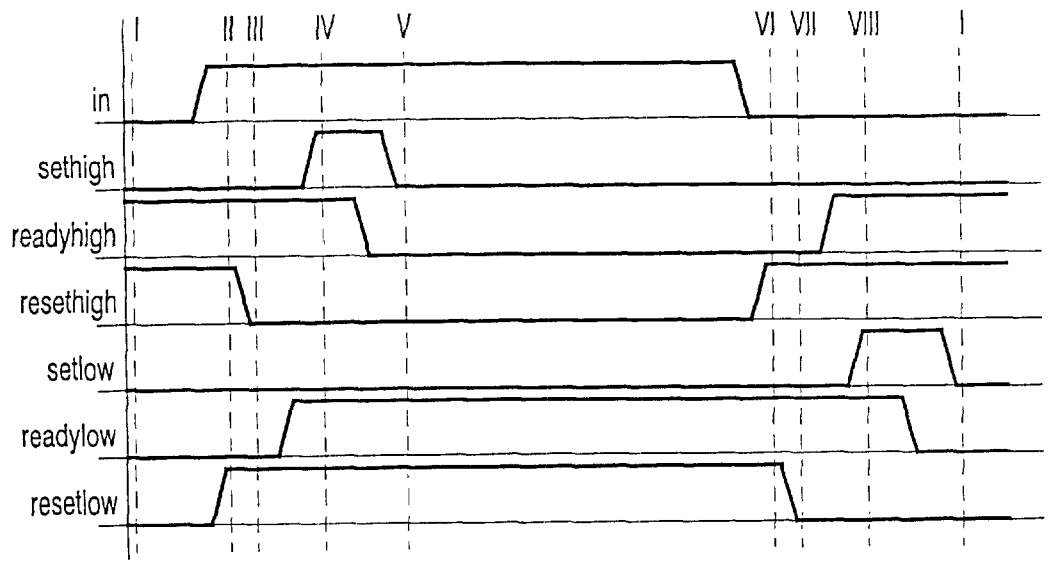

To illustrate this FIG. 2 shows the signal timing.

Consider the situation that the output of the switching unit is in the low position, i.e. the lowside switch is on and the highside switch is off. In this situation the readylow, resetlow and sethigh signals are low while the readyhigh and resethigh signals are high (I). The value of the setlow signal is not important since the lowside switch has already been set so it will be assumed low. In this situation the handshake logic waits for a transition at the input in. Now the following sequence of events will take place. First, the resetlow signal goes high (II) and the resethigh signal goes low (III). These events can also take place at the same time but for safety an overlap of reset signals is preferred. Following the resetlow signal the lowside switch switches off, the highside driver was already reset, removing the resethigh signal does not affect the highside. When the lowside switch is off the readylow signal will go high. As soon as this happens the sethigh signal goes high (IV). Following sethigh the highside switch switches on. When the highside switch is on the readyhigh signal will go low. As soon as this happens the sethigh signal can be made low again(V). Now the output of the switching unit is in the high position. The transition back to the low position is executed in a similar manner.

Now consider only the set and reset signals. The sequence in which the set and reset signals are generated follows a cyclic pattern of eight states as indicated in FIG. 2. The transition between these states is synchronized by the input signal IN and the ready signals. In the switching unit the set and reset signals are generated by an asynchronous sequential logic circuit called the carrousel. The carrousel has the set and reset signals as outputs and the in and ready signals as inputs. Further, an enable input is used that can be used to force the carrousel in a state where both resets are high.

Figure 3:
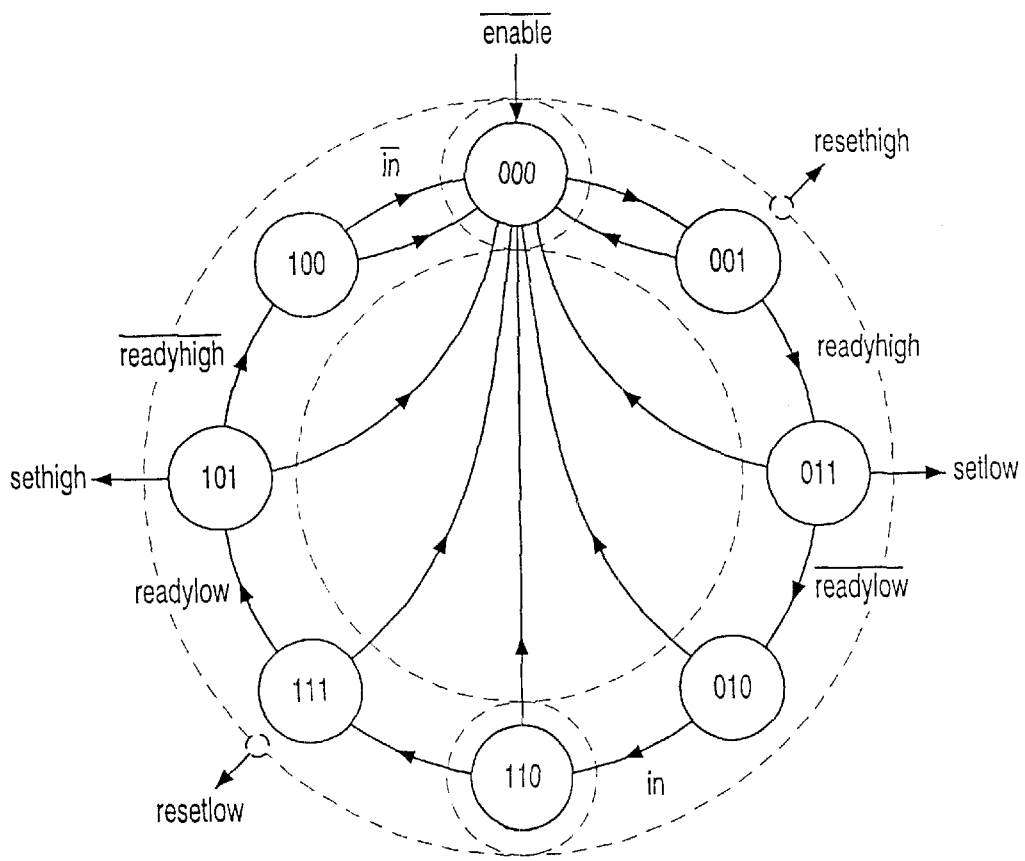

A state transition diagram of the carrousel is shown in FIG. 3.

The set and reset signals are automatically generated in the correct sequence when the carrousel starts running through the states. The carrousel has been designed in such a way that the first action when enables is to switch the output of the switching unit to the low position thus allowing the (potentially uncharged) bootstrap capacitor to be charged. the timing of the transitions is controlled by the input and ready signals. A jump to state 000 is made from any state if the enable signal is made low or if both ready signals are low simultaneously, which indicates that both switches are on at the same time, a situation which under normal conditions can never occur.

Although this approach may seem a bit complex it has a number of important advantages.

1. No direct path exists between both switches, therefore no interference can occur between the switches during the voltage transients at the output. The carrousel is essentially a Moore machine as opposed to a Mealy machine, i.e. there is no direct connection between the input signals and the output signals. The output signals are strictly decoded from the internal state variables while the input signals cause the state transitions.
2. The sequence of events necessary to complete one cycle of the carrousel guarantee that the output of the switching unit will finish each output transition completely before switching back. Consequently, the time between two output transitions is limited by the internal speed of the carrousel. If the input changes too fast, the carrousel does not try to follow but simply continues as fast as it can. If the switching unit is used in a PWM loop it automatically limits the modulation depth.
3. The system is robust against process and temperature variations. A sufficiently long dead time is guaranteed by the handshake procedure.

Figure 4:
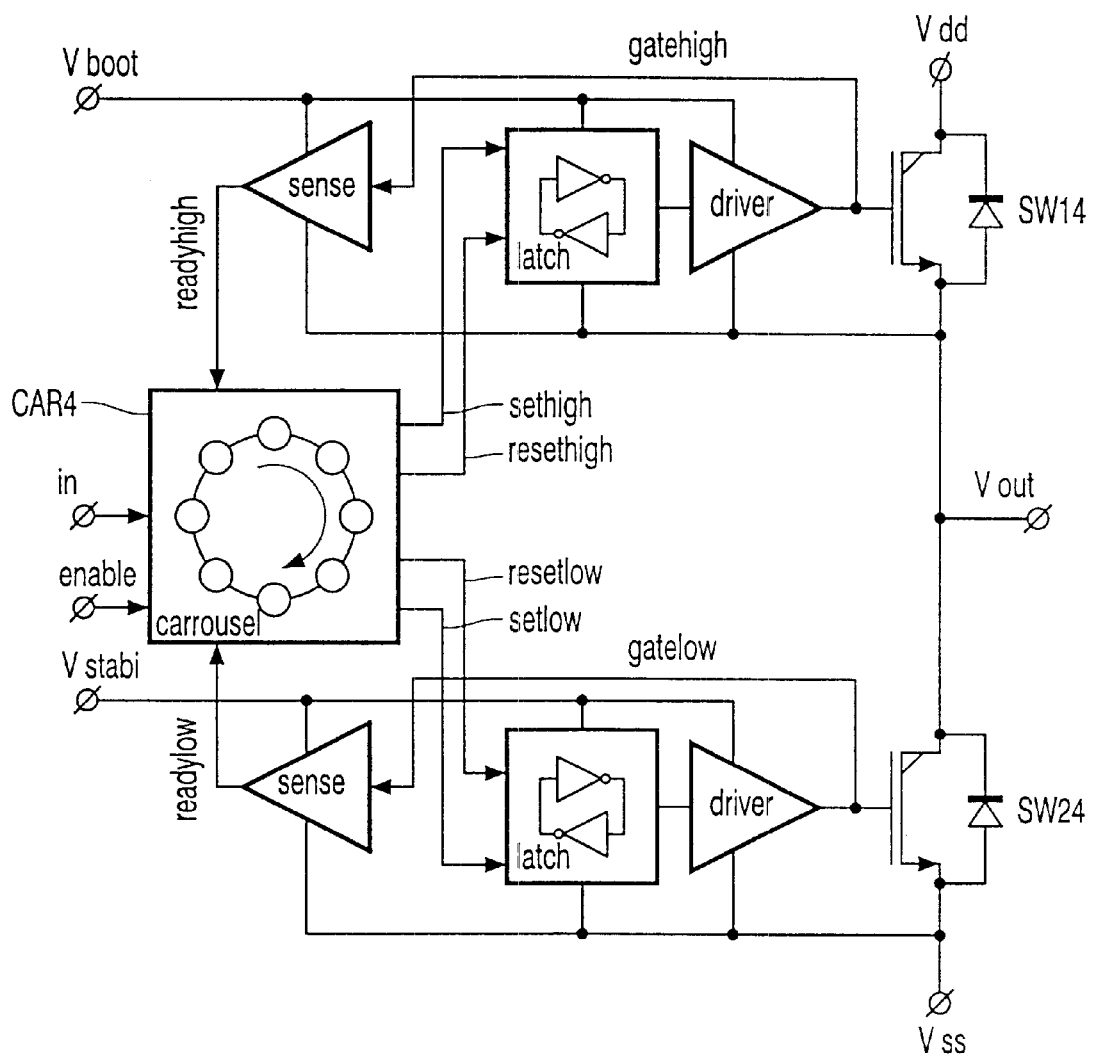

A schematic of the switching unit SU4 including the handshake is shown in FIG. 4.

One of the few things that can be improved in the switching unit is that for some reason the bootstrap capacitor is not fully charged. A situation is conceivable where the voltage across the bootstrap capacitor is high enough to drive the power DMOS transistor (i.e. higher than the threshold voltage) but not high enough to allow correct operation of the highside driver circuits. This situation is avoided by including an enable circuit in the driver that enables the driver only if the voltage across the bootstrap capacitor is higher than for example three threshold voltages (~7.5V). The enable circuit can be designed in such a way that it consumes a small DC current. Besides supplying the enable circuit this DC current will also take care of a gradual discharge of the bootstrap capacitor if the switching unit is shut down. The ready circuit has to be designed in such a way that it generates the appropriate signals even if the driver is not enabled. Otherwise the carrousel is deadlocked when waiting for the readyhigh signal.

If the driver enable circuit is also included in the lowside driver it automatically prevents the switching unit from operating of the stabivoltage is too low.

Figure 5:
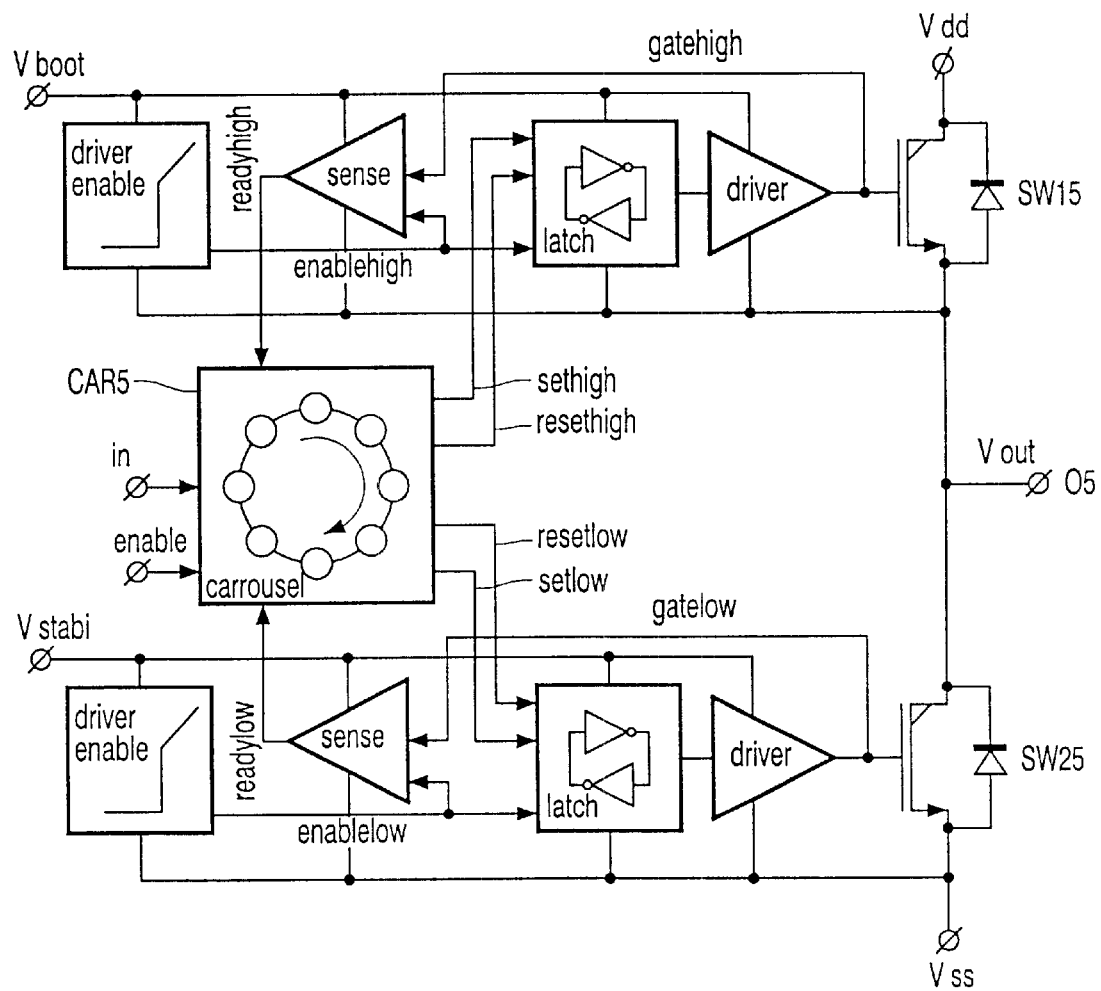

An overview of the complete switching unit system is shown in FIG. 5. Although the lowside driver could be made somewhat simpler it has been decided here to use the same driver for both highside and lowside in order to improve symmetry and design efficiency.

The design of the carrousel is done in a straightforward formal way. Starting from the state transition diagram a karnaugh map is constructed.

Figure 6:
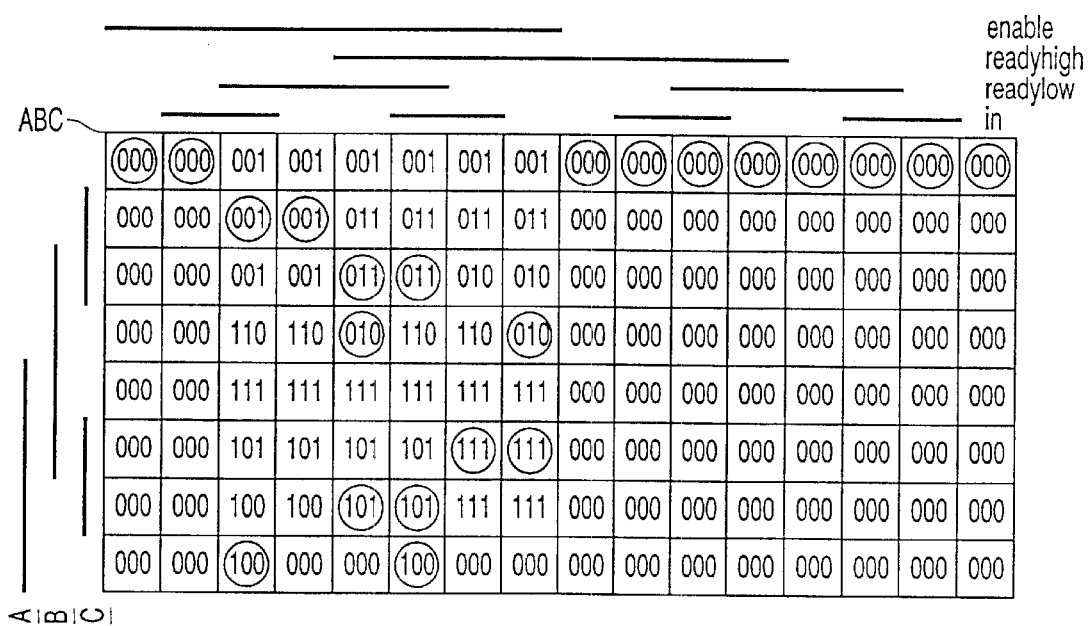
FIG. 6 shows a karnaugh map of the carrousel.

The resulting karnaugh map is shown in FIG. 6.

The input signals of the carrousel are located along the horizontal side. The states are encoded by three state bits A, B and C, that are located along the vertical side. Stable states are indicated with a circle.

From the karnaugh map in FIG. 6 the set- and reset conditions for the three state bits can be derived. This is done by making separate karnaugh maps for all three bits.

Figure 7:
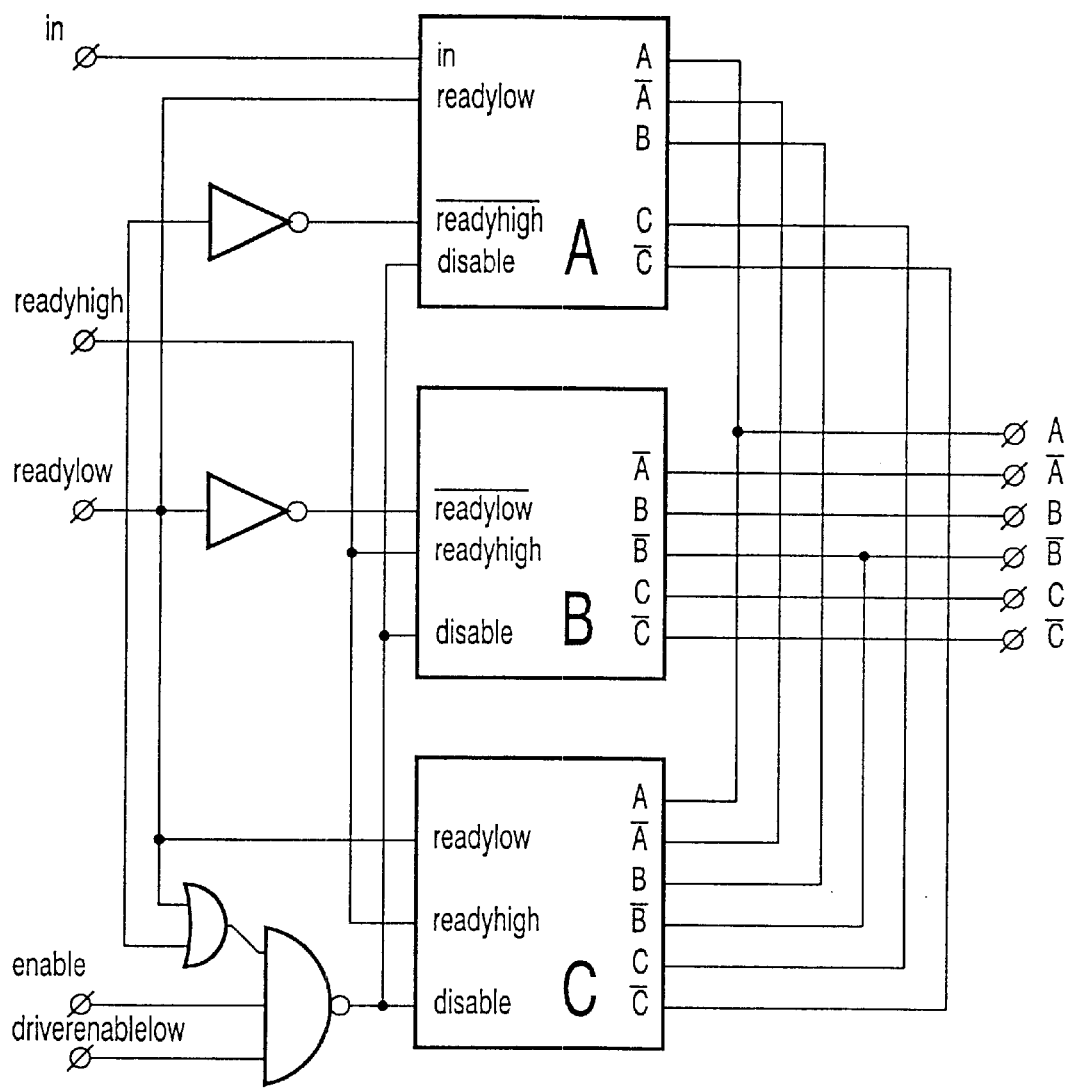
FIG. 7 shows a logic implementation of the carrousel.

The resulting carrousel implementation is shown in FIG. 7. For correct operation it is necessary that the enable signal is low when the supply voltage is switched on.

It is to be noticed that the carrousel also can be used with complementary switching units. Than no bootstrap is present, but the timing is the same.

What is claimed is:

1. Push-pull amplifier having an input for receiving an input signal and an output for supplying an output signal, which push-pull amplifier comprises a pulse-width modulator comprising at least two integrators, a comparator and a feedback element, a switching unit having at least two switches coupled to the output of the pulse-width modulator and a demodulation filter coupled to the output of the switching unit, wherein the switching unit further comprises a logic circuit for supplying control signals to the switches having a carrousel part for performing a sequence of logic states for controlling the at least two switches and a handshake part for handshaking.

2. Push-pull amplifier as claimed in claim 1, wherein the push-pull amplifier is a class D amplifier.

3. Logic Circuit for use in a push-pull amplifier according to claim 1.

4. The push-pull amplifier of claim 1, wherein the carrousel part performs a sequence of at least three logic states for controlling the at least two switches.

5. The push-pull amplifier of claim 1, wherein the feedback element couples an input of one of the at least two integrators to an output of the switching unit.

6. The push-pull amplifier of claim 1, wherein the handshake part comprises:
   a first latch coupled to an output of the carrousel part and a input of a first driver, wherein an output of the first driver is coupled to an input of the first switch; and
   a second latch coupled to an output of the carrousel part and a input of a second driver, wherein an output of the second driver is coupled to an input of the second switch.

7. The push-pull amplifier of claim 6, wherein the handshake part further comprises:
   a first sense device, wherein the output of the first driver is further coupled to an input of the first sense device, and wherein an output of the first sense device feeds the carrousel part; and
   a second sense device, wherein the output of the second driver is further coupled to an put of the second sense device, and wherein an output of the second sense device feeds the carrousel part.

8. The push-pull amplifier of claim 1, wherein the demodulation filter comprises an inductor and a capacitor.

9. The push-pull amplifier of claim 1, wherein the input of a first one of the at least two integrators is coupled to an output of a second one of the at least two integrators.

10. The push-pull amplifier of claim 9, wherein the input of the first one is further coupled to an oscillator.

11. A push-pull amplifier having an input for receiving an input signal and an output for supplying an output signal, comprising:
- a pulse-width modulator having a first integrator, a second integrator, a comparator and a feedback element, wherein an output of the first integrator is coupled to an input of the second integrator;
- a switching unit coupled to the output of the pulse-width modulator, wherein the switching unit comprises a first switch, a second switch and a switch control unit, and wherein the switch control unit includes a carrousel component for performing a sequence of logic states and a handshake component for performing a handshake; and
- a demodulation filter coupled to an output of the switching unit.

12. The push-pull amplifier of claim 11, wherein the input of the second integrator is further coupled to an oscillator.

13. The push-pull amplifier of claim 11, wherein the feedback element couples an input of the first integrator to an output of the switching unit.

14. The push-pull amplifier of claim 11, wherein the handshake component comprises:
- a first latch coupled to an output of the carrousel component and a input of a first driver, wherein an output of the first driver is coupled to an input of the first switch; and
- a second latch coupled to an output of the carrousel component and a input of a second driver, wherein an output of the second driver is coupled to an input of the second switch.

15. The push-pull amplifier of claim 14, wherein the handshake component further comprises:
- a first sense device, wherein the output of the first driver is further coupled to an input of the first sense device, and wherein an output of the first sense device feeds the carrousel component; and
- a second sense device, wherein the output of the second driver is further coupled to an input of the second sense device, and wherein an output of the second sense device feeds the carrousel component.

16. A push-pull amplifier having an input for receiving an input signal and an output for supplying an output signal, comprising:
- a pulse-width modulator having a first integrator, a second integrator, a comparator and a feedback element;
- a switching unit coupled to the output of the pulse-width modulator, wherein the switching unit comprises a first switch, a second switch and a switch control unit, and wherein the switch control unit includes a carrousel component for performing a sequence of at least three logic states and a handshake component for performing a handshake; and
- a demodulation filter coupled to an output of the switching unit.

17. The push-pull amplifier of claim 16, wherein an output of the first integrator is coupled to an input of the second integrator.

18. The push-pull amplifier of claim 16, wherein the handshake component comprises:
- a first latch coupled to an.output of the carrousel component and a input of a first driver, wherein an output of the first driver is coupled to an input of the first switch; and
- a second latch coupled to an output of the carrousel component and a input of a second driver, wherein an output of the second driver is coupled to an input of the second switch.

19. The push-pull amplifier of claim 18, wherein the handshake component further comprises:
- a first sense device, wherein the output of the first driver is further coupled to an input of the first sense device, and wherein an output of the first sense device feeds the carrousel component; and
- a second sense device, wherein the output of the second driver is further coupled to an input of the second sense device, and wherein an output of the second sense device feeds the carrousel component.

20. The push-pull amplifier of claim 16, wherein the carrousel component performs a sequence of at least three logic states for controlling the first switch and the second switch.

* * * * *